(12) United States Patent
Savin

(10) Patent No.: US 8,386,880 B2
(45) Date of Patent: Feb. 26, 2013

(54) METHOD FOR TRANSMITTING NON-BINARY CODES AND DECODING THE SAME

(75) Inventor: Valentin Savin, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 312 days.

(21) Appl. No.: 12/900,889

(22) Filed: Oct. 8, 2010

(65) Prior Publication Data

US 2011/0119554 A1 May 19, 2011

(30) Foreign Application Priority Data

Oct. 9, 2009 (FR) ...................................... 09 57062

(51) Int. Cl.
*H03M 13/00* (2006.01)
(52) U.S. Cl. ........................................ 714/752; 714/758
(58) Field of Classification Search .................. 714/752, 714/758
See application file for complete search history.

(56) References Cited

U.S. PATENT DOCUMENTS

| | | | | |
|---|---|---|---|---|
| 2008/0222486 | A1* | 9/2008 | Richardson et al. | 714/757 |
| 2011/0029845 | A1* | 2/2011 | Zhou et al. | 714/776 |
| 2011/0087946 | A1* | 4/2011 | Planjery et al. | 714/752 |

FOREIGN PATENT DOCUMENTS

| GB | 2 455 274 A | 6/2009 |
|---|---|---|

OTHER PUBLICATIONS

International Search Report issued Jan. 18, 2011, in PCT/EP2010/064533 with English translation of category of cited documents.
Charly Poulliat, et al., Design of Regular (2, $d_c$)-LDPC Codes over GF(q) Using Their Binary Images. IEEE Transactions on Communications, vol. 56, No. 10, XP-011236194, Oct. 2008, pp. 1626-1635.
R. G. Gallager, "Low-Density Parity-Check Codes", Published in IEEE Trans. Inform. Theory, vol. IT-8, 1962, pp. 21-28.
Claude Berrou, et al., "Near Optimum Error Correcting Coding and Decoding: Turbo-Codes", published in IEEE Trans. Inform. Theory, vol. 44, No. 10, Oct. 1996, pp. 1261-1271.
Valentin Savin, "Min-Max Decoding for non binary LDPC codes", published in IEEE Int. Symp. on Information Theory (ISIT), Toronto, Canada, Jul. 6-11, 2008 pp. 960-964.
Jinghu Chen, et al., "Near Optimum Universal Belief Propagation Based Decoding of Low-Density Parity Check Codes", IEEE Transactions on Communications, vol. 50, No. 3, Mar. 2002, pp. 406-414.
Valentin Savin, "Self-Corrected Min-Sum decoding of LDPC codes", IEEE Int. Symp. on Information Theory (ISIT), Toronto, Canada, 2008 pp. 1-5.

* cited by examiner

*Primary Examiner* — Sam Rizk
(74) *Attorney, Agent, or Firm* — Oblon, Spivak, McClelland, Maier & Neustadt, L.L.P.

(57) ABSTRACT

The invention relates to a decoding method for non-binary codes, in particular non-binary LDPC codes, amenable to representation by a bipartite graph representing N variables and M constraints. The invention also relate to a transmission method for transmitting non-binary codes, in particular non-binary LDPC codes, and to a reception to receive the same. The invention can be applied in particular to an IR-HARQ or a cooperative network using a non-binary code, in particular a non-binary LDPC code.

20 Claims, 9 Drawing Sheets

$$\mathbf{H} = \begin{pmatrix} 1 & 3 & 4 & 6 & 0 & 0 \\ 0 & 2 & 0 & 7 & 1 & 5 \\ 5 & 0 & 1 & 0 & 2 & 4 \end{pmatrix}$$

$$\mathbf{H_{bin}} = \left(\begin{array}{ccc|ccc|ccc|ccc|ccc|ccc} 1 & 0 & 0 & 1 & 0 & 1 & 0 & 1 & 0 & 0 & 1 & 1 & 0 & 0 & 0 & 0 & 0 & 0 \\ 0 & 1 & 0 & 1 & 1 & 1 & 0 & 1 & 1 & 1 & 1 & 0 & 0 & 0 & 0 & 0 & 0 & 0 \\ 0 & 0 & 1 & 0 & 1 & 1 & 1 & 0 & 1 & 1 & 1 & 1 & 0 & 0 & 0 & 0 & 0 & 0 \\ \hline 0 & 0 & 0 & 0 & 0 & 1 & 0 & 0 & 0 & 1 & 1 & 1 & 1 & 0 & 0 & 1 & 1 & 0 \\ 0 & 0 & 0 & 1 & 0 & 1 & 0 & 0 & 0 & 1 & 0 & 0 & 0 & 1 & 0 & 0 & 0 & 1 \\ 0 & 0 & 0 & 0 & 1 & 0 & 0 & 0 & 0 & 1 & 1 & 0 & 0 & 0 & 1 & 1 & 0 & 0 \\ \hline 1 & 1 & 0 & 0 & 0 & 0 & 1 & 0 & 0 & 0 & 0 & 0 & 0 & 0 & 1 & 0 & 1 & 0 \\ 0 & 0 & 1 & 0 & 0 & 0 & 0 & 1 & 0 & 0 & 0 & 0 & 1 & 0 & 1 & 0 & 1 & 1 \\ 1 & 0 & 0 & 0 & 0 & 0 & 0 & 0 & 1 & 0 & 0 & 0 & 0 & 1 & 0 & 1 & 0 & 1 \end{array}\right)$$

$\overline{H}_{bin} =$ (permuted binary matrix)

Fig. 5

METHOD FOR TRANSMITTING NON-BINARY CODES AND DECODING THE SAME

TECHNICAL FIELD

The present invention relates to the transmission and decoding of error correction codes in the field of telecommunications or data recording. More specifically, the invention relates first to a message-passing decoding method for non-binary codes, particularly for non-binary LDPC (Low-Density Parity Check) codes and second to a method for transmitting non-binary LDPC codes.

PRIOR STATE OF THE ART

LDPC codes were introduced by R. Gallager in his paper entitled "Low density parity check codes" published in IEEE Trans. Inform. Theory, Vol. IT-8, pages 21-28, 1962, and their interesting properties were only recently rediscovered when the power of iterative decoding was highlighted in turbo-codes. A description of iterative decoding of turbo-codes is found in the seminal paper by C. Berrou et al. entitled "Near optimum error correcting coding and decoding: turbo-codes" published in IEEE Trans. Inform. Theory, Vol. 44, No. 10, pages 1261-1271, 1996.

Like turbocodes, LDPC codes are amenable to representation by a bipartite graph.

The term bipartite graph refers to an undirected graph whose vertex set consists of two disjoint subsets such that no two vertices of the same subset are connected by an edge of the graph.

Generally, certain error connection codes are amenable to representation by a bipartite graph. This graph is partitioned into a first subset of vertices associated with the symbols constituting a codeword, called variable vertices, and a second subset of vertices associated with code constraints, called check vertices. A bipartite graph associated with a group of constraints is also called a Tanner graph. When the symbols of the codeword are binary, the code constraints are called parity checks. In what follows, therefore, for the sake of clarity, we will use the specific term "parity check" when a binary code is involved and the more general term "constraint" when a non-binary code is involved.

The symbols in the codeword are generally elements of the Galois field $F_2=\{0,1\}$, otherwise known as bits, but they can more generally be elements of an alphabet of size $q \geq 2$, for example a field $F_2$, with with arbitrary characteristic 2, that is a $2^p$-ary alphabet (hence $q=2^p$).

Codes amenable to representation by a bipartite graph can be decoded using iterative message-passing decoding, also called MP (for Message Passing) or BP (for Belief Propagation). A generic description of this decoding method can be found in N. Wiberg's thesis entitled "Codes and decoding on general graphs," 1996. MP type iterative decoding is in fact a generalization of algorithms well-known in the field of decoding, to with the "forward-backward" algorithm used for turbo-codes and the Gallager algorithm used for LDPC codes.

Message-passing decoding of a non-binary code differs from that of a binary code.

In fact, for binary codes such as binary LDPC codes, each variable vertex represents a coded bit. When there is uncertainty about the value of a bit, it is expressed in terms of the probability of the values or 1, or more often as a logarithmic likelihood ratio, called LLR (Log Likelihood Ratio), defined as the logarithm of the ratio of those probabilities. Messages exchanged between vertices of the bipartite graph are then expressed, as the case may be, in terms of probability or of LLR.

For non-binary codes, each variable vertex represents a coded symbol, which is an element of the code alphabet. When there is uncertainty about the value of a symbol, this uncertainty can be represented by a vector of q−1 probabilities, where q is the size of the alphabet (q−1 probabilities are sufficient because the sum of the q probabilities is equal to 1), or q−1 LLR values. Messages passed between the vertices of the bipartite graph are also expressed, as the case may be, in the form of vectors of q−1 probability values or q−1 LLR values.

FIG. 1 shows an example of a bipartite graph for a non-binary code, more particularly an LDPC code defined on $F_8$ having as its parity matrix a matrix of size M×N where N=6 is the number of variables and M=3 is the number of constraints:

$$H = \begin{pmatrix} 1 & 3 & 4 & 6 & 0 & 0 \\ 0 & 2 & 0 & 7 & 1 & 5 \\ 5 & 0 & 1 & 0 & 2 & 4 \end{pmatrix} \quad (1)$$

It should be noted that the coefficients of the matrix are elements of $F_8$. The variable vertices $X_1, \ldots, X_N$ are shown on the left portion of the graph and the constraint vertices $Y_1, \ldots, Y_M$ on the right portion. In the present case:

$Y_1: X_1+3X_2+4X_3+6X_4=0$ $Y_2: X_2+7X_4+X_5+5X_6=0$ $Y_3: 5X_1+X_3+2X_5+4X_6=0$ \quad (2)

The messages of the variables $X_1, \ldots, X_6$ and of the constraints $Y_1, \ldots, Y_1$ can each be expressed as a vector of probabilities of size 7.

The graph's incidence matrix corresponds to the code's parity matrix, in other words the weights assigned to the graph's edges represent the coefficients of matrix H. By convention, when the weight is zero, the corresponding edge is omitted from the graph.

Though non-binary LDPC codes offer better correction capabilities than binary LDPC codes, they are on the other hand more difficult to decode. In fact, the complexity of the decoding algorithm is generally proportional to that is to the square of the size of the alphabet. One method for decoding non-binary LDPC codes was described for example in the paper by V. Savin entitled "Min-Max decoding for non binary LDPC codes," published in IEEE Int. Symp. on Information Theory (ISIT), Toronto, Canada, 2008.

A person skilled in the art might think that a natural way of decoding non-binary codes would be to use an equivalent binary representation of the parity matrix. As we shall see, however, this "natural" binary representation would lead to poor decoding performance and a high error rate.

It is known that LDPC codes, both binary and non-binary, have the property of showing a low density of nonzero coefficients in the parity matrix. This property results in a small number of short cycles in the bipartite graph. These cycles tend to cause self-confirmation of the variables and the checks in an iterative decoding process. This means that an erroneous value of a vertex can be confirmed due to the simple fact that the messages transmitted to it by its neighbors are themselves dependent on the messages that this vertex transmits to them. To combat this self-confirmation phenomenon, the decoding process must adhere to the so-called extrinsic information principle: a message transmitted by a sending vertex to a receiving vertex is calculated from all the messages received by the sending vertex except that coming from the receiving vertex. However, adhesion to the extrinsic information principle does not exclude self-confirmation at higher orders, due to the cycles present in the bipartite graph, these self-confirmations being more frequent with shorter cycles.

The extrinsic information principle is schematically illustrated in FIG. 2. Shown here is a portion of a bipartite graph in which $Y_1, Y_2, Y_3$ are check vertices and $X_1, \ldots, X_1$ are variable vertices. The message of the constraint vertex $Y_1$ directed to the variable vertex $X_1$ is calculated from messages received by $Y_1$ from variable vertices $X_2, X_3, X_4$, without considering the message received from $X_1$. Conversely, the message from check vertex $X_1$ directed to check vertex $Y_1$ is calculated from messages received by $X_1$ from check vertices $Y_2$ and $Y_3$ without considering the message received from $Y_1$.

FIG. 3 illustrates the self-confirmation phenomenon due to the presence of a cycle in the bipartite graph. As before, a portion of the graph is shown, variable vertices being shown as circles and check vertices as squares. The cycle in the graph is shown with heavy lines. Following this cycles reveals that message $m_6$ received by variable vertex $X_5$ depends indirectly on message $m_1$ transmitted by the same vertex a few decoding iterations earlier, through successive messages $m_2$ to $m_5$.

Considered hereafter is an alphabet A with q elements. The elements of A shall be called "symbols." We assume for the sake of simplification but without loss of generality that $q=2^p$ is a power of 2. Then there exists a bijection of A onto $F_2^p$:

$$\omega : A \xrightarrow{\sim} F_2^p \qquad (3)$$

where $F_2=\{0,1\}$ is the two-element field. A binary vector $x=(x_0, x_1, \ldots, x_{p-1}) \in F_2^p$ is called a "binary image" of symbol $X \in A$ if $\omega(X)=x$.

Bijection $\omega$ provides A with a vector $F_2$-space structure. We denote $L=L_{F_2}(A)$ the algebra of the $F_2$-endomorphisms of A, that is of the endomorphisms of A provided with its vector $F_2$-space structure. The evaluation of the elements of L on the symbols of A defines an action of L on A, which is denoted multiplicatively:

$$L \times A \to A : (h, X) \mapsto hX \qquad (4)$$

Let $H \in M_{M,N}(L)$, that is to say let H be a matrix of size $M \times N$ whose elements are from L.

A non-binary code $C \subset A^N$ is defined by:

$$C = Ker(H) \subset A^N \qquad (5)$$
$$= \left\{ (X_1, \ldots, X_N) \in A^N \,\middle|\, \sum_{n=1}^{N} h_{m,n} X_n = 0, \; \forall m = 1, \ldots, M \right\}$$

H will be called the constraint matrix of code C. Using bijection $\omega$, we can match each sequence of symbols $(X_1, \ldots, X_N) \in A^N$ to a binary sequence $(x_{1,0}, x_{1,1}, \ldots, x_{1,p-1}, \ldots, x_{N,0}, x_{N,1}, \ldots, x_{N,p-1}) \in F_2^{N_p}$ by replacing each symbol $X_n$ with its binary image. This binary sequence (of length $N_p$) shall be called the "binary image" of sequence $(X_1, \ldots, X_N) \in A^N$. The binary images of all the codewords $(X_1, \ldots, X_N) \in C \subset A^N$ form a binary code $C_{bin} \subset F_2^{N_p}$ called the "binary image of C."

The isomorphism $\omega$ between A and $F_2^p$ induces an isomorphism between $L_{F_2}(A)$ and $L_{F_2}(F_2^p)$:

$$L = L_{F_2}(A) \xrightarrow{\sim} L_{F_2}(F_2^p) = M_p(F_2) \qquad (6)$$

Thus, by replacing each element $h_{m,n}$ of matrix H with its image via isomorphism (6) above, a binary matrix $H_{bin} \in M_{M_p,N_p}(F_2)$ is obtained. This matrix is the parity matrix of binary code $C_{bin}$.

It will be noted that non-binary codes defined on $F_q$, that is on the finite field with q elements, represent a special case in non-binary codes. The alphabet of such a code is $A=F_q$, and its vector $F_2$-space structure is induced by internal addition on $F_q$. In addition, the operation of multiplication on $F_q$ defines an embedding of $F_q$ as a vector subspace of $L=L_{F_2}(A)$ (i.e. $F_q \subset L$). We say that "code C is defined on $F_q$" if it is defined as the kernel of a matrix $H \in M_{M,N}(F_q) \subset M_{M,N}(L)$. In this case, all the elements of matrix H belong to $F_q$, $h_{m,n} \in F_q$, and multiplications $h_{m,n} X_n$ within (5) are simply internal multiplications within field $F_q$.

For the sake of illustration, we will give an example of the binary representation of a simple non-binary code.

We consider an alphabet A with 8 elements, consequently isomorphic with $F_8$. We will adopt conventionally a primitive representation of $F_8$. More particularly, $F_8$ is isomorphic with $F_2[D]/P(D)$, quotient ring of $F_2[D]$ by the ideal generated by the irreducible polynomial $P(D)=1+D+D^3$. Addition and multiplication within $F_8$ are defined by the addition and the multiplication of polynomials, modulo $P(D)$. To simplify, we will assume that $F_8=\{0, 1, \ldots 7\}$. Thus, the binary image of a symbol $X \in F_8=\{0, 1, \ldots, 7\}$ is the binary sequence $(x_0, x_1, x_2)$ corresponding to the polynomial expression $$X = \sum_{i=0}^{p-1} x_i 2^i).$$

In general, X is represented by the polynomial $$X(D) = \sum_{i=0}^{p-1} x_i D^i,$$

whose coefficients are given by its binary image. The sum of two symbols X, $Y \in F_8=\{0, 1, \ldots, 7\}$ corresponds to the bitwise sum of X and Y. Their product is defined by the remainder, modulo $$X(D) = \sum_{i=0}^{p-1} x_i D^i \text{ and } Y(D) = \sum_{i=0}^{p-1} y_i D^i.$$

We will consider a non-binary code defined by a single linear constraint on $F_8$:

$$3X+4Y+6Z=0 \qquad (7)$$

Recall that in this case $L=A=F_8$.

By using the binary representation of the elements of $F_8$ and more specifically isomorphism (6) to represent $3,4,6 \in L$ and isomorphism (3) to represent X, Y, $Z \in A$, the equation above becomes:

$$(1+D)(x_0+x_1 D+x_2 D^2)+D^2(y_0+y_1 D+y_2 D^2)+(D^2+D)(z_0+z_1 D+z_2 D^2)=0 \qquad (8)$$

further, recalling that $D^3=1+D[P(D)]$:

$$\begin{cases} x_0 + x_2 + y_1 + z_1 + z_2 = 0 \\ x_0 + x_1 + x_2 + y_1 + y_2 + z_0 + z_1 = 0 \\ x_1 + x_2 + y_0 + y_2 + z_0 + z_1 + z_2 = 0 \end{cases} \quad (9)$$

$$\begin{pmatrix} 1 & 0 & 1 \\ 1 & 1 & 1 \\ 0 & 1 & 1 \end{pmatrix} \begin{pmatrix} x_0 \\ x_1 \\ x_2 \end{pmatrix} + \begin{pmatrix} 0 & 1 & 0 \\ 0 & 1 & 1 \\ 1 & 0 & 1 \end{pmatrix} \begin{pmatrix} y_0 \\ y_1 \\ y_2 \end{pmatrix} + \begin{pmatrix} 0 & 1 & 1 \\ 1 & 1 & 0 \\ 1 & 1 & 1 \end{pmatrix} \begin{pmatrix} z_0 \\ z_1 \\ z_2 \end{pmatrix} = 0 \quad (10)$$

The constraint matrix $H \in M_{1,3}(F_8)$ and its binary image $H_{bin} \in M_{3,9}(F_2)$ are obtained from equations (7) and (10), respectively. We have ultimately:

$$H(3\ 4\ 6) \quad (11)$$

and $$H_{bin} = \begin{pmatrix} 1 & 0 & 1 & 0 & 1 & 0 & 0 & 1 & 1 \\ 1 & 1 & 1 & 0 & 1 & 1 & 1 & 1 & 0 \\ 0 & 1 & 1 & 1 & 0 & 1 & 1 & 1 & 1 \end{pmatrix} \quad (12)$$

The bipartite graphs corresponding respectively to the constraint matrix H of the non-binary code and to the parity matrix $H_{bin}$ of its binary image are respectively illustrated in FIGS. 4A and 4B. The presence in the binary graph of many short cycles (of length 4) is noted, while the non-binary graph is acyclic.

Generally, the binary representation of a code that is non-binary, whether acyclic or not, can include a large number of small cycles. A person skilled in the art will understand that although the binary representation is equivalent from an algebraic point of view, it leads to varying performance in terms of decoding.

A first problem on which the invention is based is consequently to propose a decoding method for a non-binary code amenable to representation by a bipartite graph, a non-binary LDPC code for example, which does not have the aforementioned disadvantages, that is one which has both low decoding complexity and a low error rate.

A second object of the invention is to propose a method for transmitting non-binary LDPC codes which is adapted to the quality of the transmission channel.

DISCLOSURE OF THE INVENTION

First, the present invention is defined by a decoding method for a non-binary code, in particular a non-binary LDPC code, amenable to representation by a bipartite graph with N variable vertices and M constraint vertices, the variables drawing their values from a non-binary alphabet A and being linearly constrained by means of a matrix of constraints, each variable being represented by a plurality p of binary values. As per this method:

for each variable, a plurality $\bar{p} > p$ of binary values, called extended binary values, is generated, obtained by $\bar{p}$ distinct linear combinations, using coefficients in $F_2$, of said p binary values, excluding the zero combination;

a parity matrix $\overline{H}_{bin}$ is calculated, called an extended parity matrix, representing parity checks on the extended binary values of the variables, called extended parity checks, said extended parity checks being induced by the constraints on said variables;

iterative message-passing decoding is carried out using a second bipartite graph, called an extended graph, representing the extended parity matrix and connecting the parity checks with the extended binary values of the variables;

the binary values of each variable are determined based on its extended binary values obtained upon completion of the iterative decoding.

For example, alphabet A can be made up of $q=2^p$ elements and $\bar{p}=q-1$.

Said extended parity matrix, $\overline{H}_{bin}$, is advantageously completed by adding additional rows, said additional rows being obtained by means of distinct linear combinations of existing rows using coefficients in $F_2$, excluding the zero combination, each row of the matrix thus completed defining an extended parity check, the extended graph then connecting the set of extended binary values of the variables to the set of extended parity checks of the matrix $\overline{H}_{bin}$ thus completed.

For example, the number of added rows will be $q-p-1$.

Preferably, at least a part of the extended binary values of each variable is initialized using its own binary values.

According to a first variant, for at least one iteration of the iterative decoding, the extended binary values of each variable are subjected to maximum-likelihood decoding to obtain estimated extended binary values confirming a set of constraints induced by said $\bar{p}$ linear combinations. For each variable, said extended binary values are then replaced by said estimated extended binary values for the purpose of continuing the iterative decoding.

According to a second variant, for at least one iteration of the iterative decoding, the messages sent by the extended binary values of each variable are corrected in the maximum-likelihood sense to confirm a set of constraints induced by said $\bar{p}$ linear combinations. For each variable, said transmitted messages will then be replaced by said corrected messages for the purpose of continuing the iterative decoding.

According to a third variant, for at least one iteration of the iterative decoding, the messages received by the extended binary values are corrected in the maximum-likelihood sense to confirm a set of constraints induced by said $\bar{p}$ linear combinations. For each variable, said received messages are then replaced by said corrected messages for the purpose of continuing the iterative decoding.

According to a particular embodiment, an auxiliary graph connecting the binary values to the extended binary values of the variables is also used, said auxiliary graph representing the linear combinations allowing the latter to be generated from the former.

In this case, the iterative decoding step can include at least one first phase of message passing between the binary values and the extended binary values of the variables, through said auxiliary graph, and a second phase of message passing between the binary values of the variables and the extended parity checks, through said extended graph.

The invention also relates to a transmission method for transmitting non binary codewords belonging to a non-binary code amenable to representation by a bipartite graph, in particular LDPC non binary code, each non-binary symbol of a codeword belonging to an alphabet A of cardinal $q=2^p$ and being represented by p bits, where p is an integer, wherein a plurality $\tilde{p}$ of bits, with $p < \tilde{p} \leq q-1$, called extended bits, are generated (920) for each non binary symbol, said extended bits being obtained by p linear combinations with coefficients from $F_2$ of said p bits, excluding the zero combination;

the extended bits thus generated are punctured (930) according to a puncturing pattern to output E extended bits per codeword;

the E extended bits thus output are converted (940) into modulation symbols of a modulation constellation;

the modulation symbols thus obtained are transmitted over a transmission channel.

Advantageously, the puncturing rate is controlled according to a quality indicator (CQI) of the transmission channel received by said transmitter.

Advantageously, the size of the modulation constellation is also controlled according to said quality indicator.

According to a variant, for each non binary symbol, the $\tilde{p}$ extended bits comprise the said p bits, referred to as trivial extended bits, and $\tilde{p}-p$ remaining bits, referred to as true extended bits, said puncturing being then performed on the true extended bits only.

Typically, the size of the modulation constellation is equal to $2^m$ and the $\tilde{p}-p$ true extended bits are punctured to retain only m−p true extended bits, the p trivial extended bits and m−p true extended bits related to a non-binary symbol being mapped into one modulation symbol of said modulation constellation. According a an example, $\tilde{p}=q-1$.

Preferably, a first plurality E of extended bits, sent in a first transmission step and a second plurality E' of extended bits, distinct from those of the first plurality, is sent in a second transmission step, on request from a receiver.

According to a variant, said trivial extended bits are sent in a first transmission step and that the true extended bits output by the puncturing are sent in a second transmission request, on a request from a receiver.

Alternatively, the trivial extended bits are sent in a first transmission packet and that the true extended bits output by the puncturing are systematically sent in a second transmission packet after said first transmission packet has been sent.

The invention finally also relates to a method for receiving non binary codewords belonging to a non-binary code, in particular non-binary LDPC code, transmitted by a transmission method as set out above, said non-binary code being amenable to representation by a bipartite graph with N variable vertices and M constraint vertices, the variables drawing their values from said alphabet A and being linearly constrained by means of a constraint matrix, each variable corresponding to a non-binary symbol of a codeword and being represented by a plurality q−1 of extended binary values, said extended binary values being obtained by q−1 linear combinations with coefficients from $F_2$ of said p binary values, wherein for each variable, $\tilde{p}$ extended binary values of said plurality of extended values are initialized with estimated values of the $\tilde{p}$ bits of the corresponding non-binary symbol received from the transmitter;

an iterative message-passing decoding process is carried on an extended graph representing an extended parity matrix connecting the extended binary values of the variables with extended parity checks;

the binary values of each variable are determined from its extended binary values, obtained at the conclusion of the iterative decoding process.

BRIEF DESCRIPTION OF THE DRAWINGS

FIG. 5 shows the respective parity matrices of a non-binary code example, of its binary image and of its extended binary image;

DETAILED DISCLOSURE OF SPECIFIC EMBODIMENTS

Figure 1:
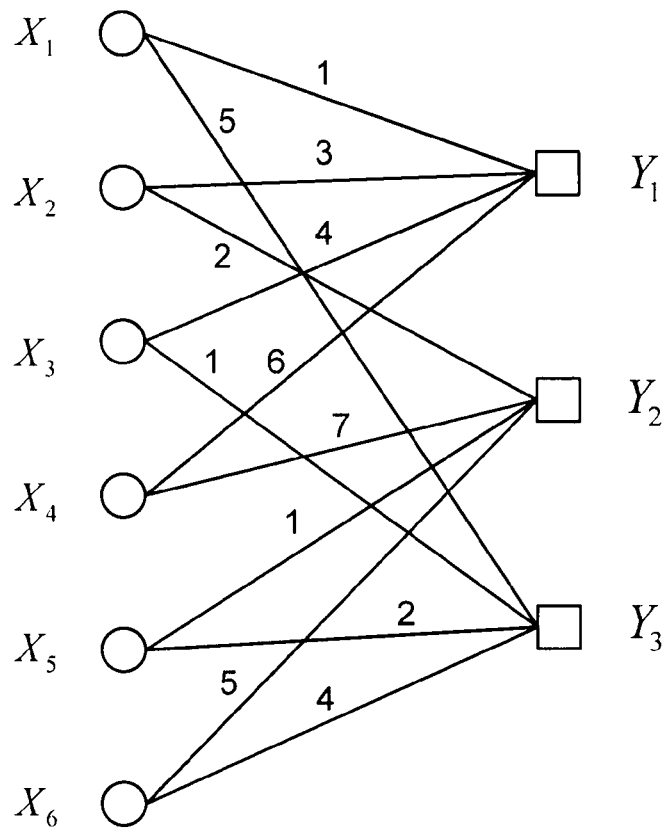
FIG. 1 shows the bipartite graph of a non-binary LDPC code example.
Figure 2:
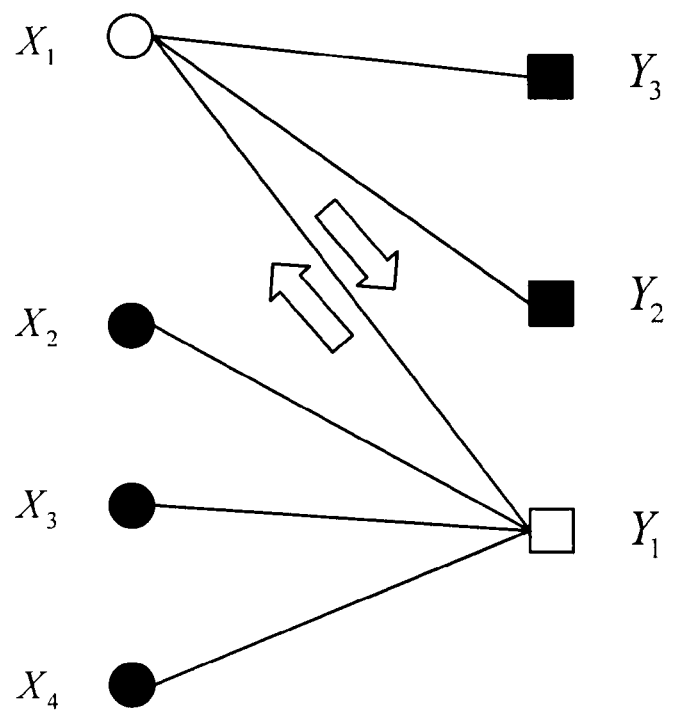
FIG. 2 shows schematically the principle of extrinsic information in an iterative message-passing decoding process.
Figure 3:
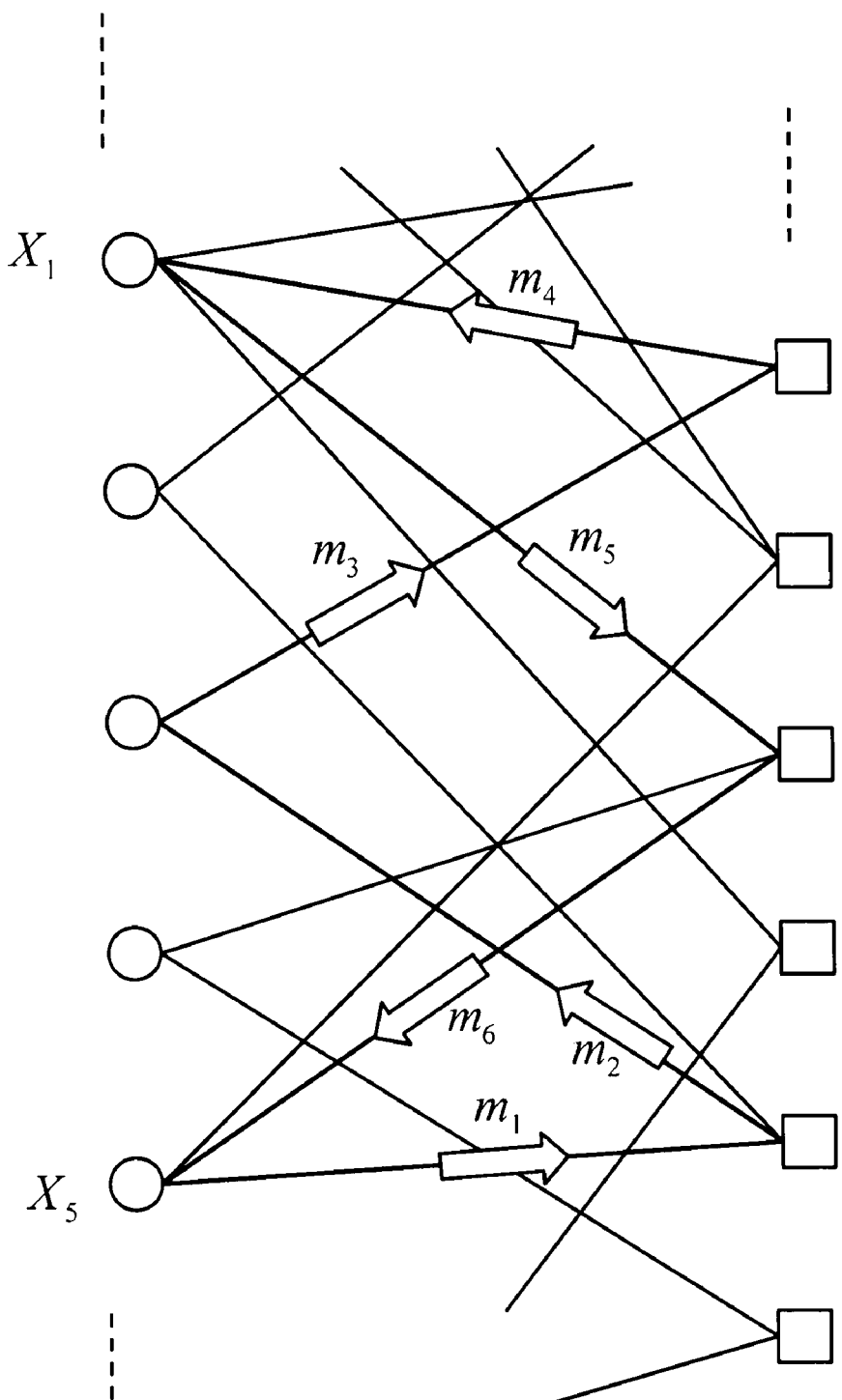
FIG. 3 shows an example of a cycle within a bipartite graph.
Figure 4A:
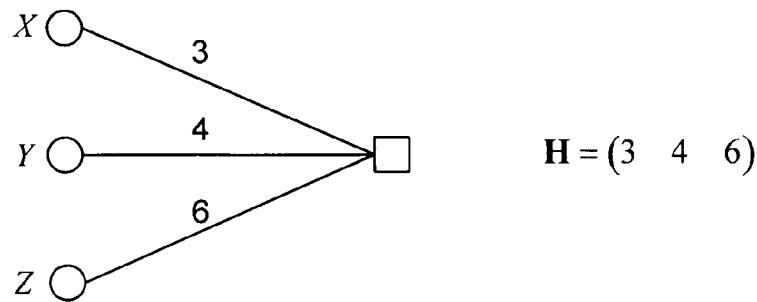
FIGS. 4A and 4B show, respectively, a bipartite graph of a non-binary code and the bipartite graph corresponding to its binary image.
Figure 4B:
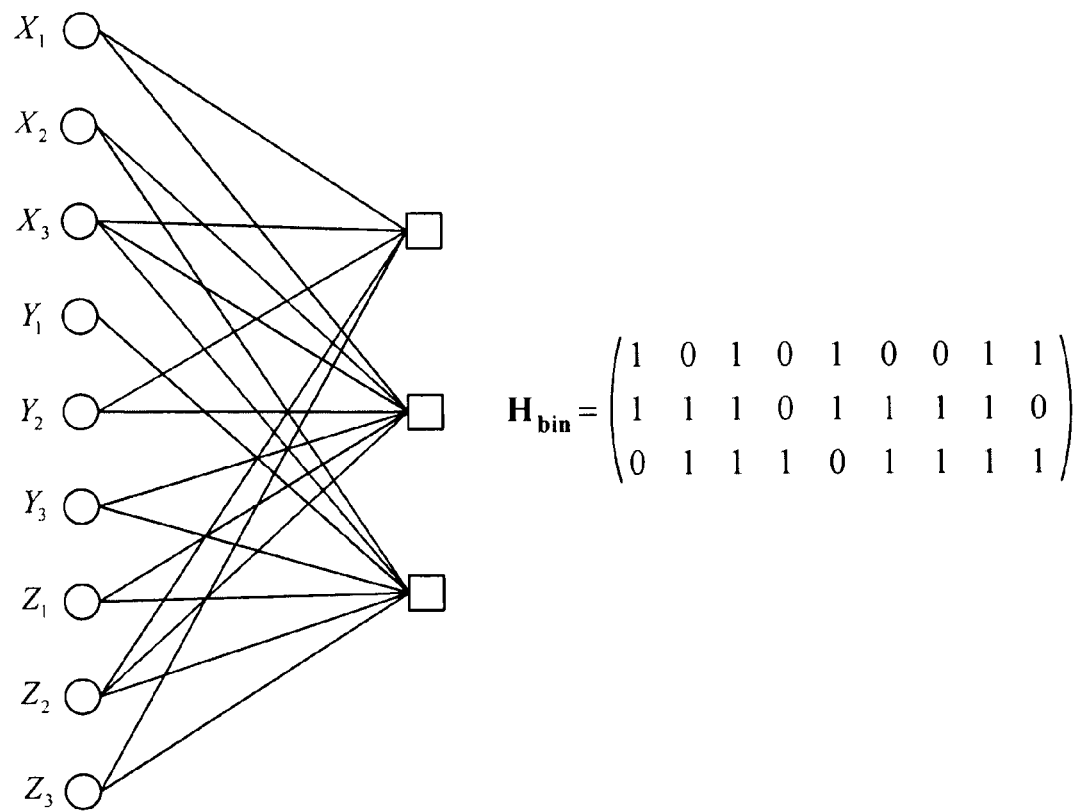

We again consider a non-binary error-correcting code defined on an alphabet A of size q, and amenable to representation by a bipartite graph with N variables and M constraints. We will assume in what follows, without loss of generality, that this correction code is a non-binary LDPC code.

By definition, the non-binary code is defined by a set of M linear equations (or constraints) in N unknowns (or variables) drawing their values from A. It is assumed, again without loss of generality, that $q=2^p$. Each code symbol can then be identified with a vector of p binary values, that is to say an element of $F_2^p$, thanks to vector space isomorphism (3). The vector or P-tuple of binary values gives the binary representation of a symbol of the non-binary alphabet. Multiplication of a symbol from A by a coefficient belonging to L within a linear equation can be identified with an $F_2$-endomorphism on A, in compliance with convention (4). This coefficient of L and therefore this $F_2$-endomorphism on A can be represented generally by a matrix of dimensions p×p with coefficients from $F_2$.

The main idea on which the invention is based is to use an extended binary representation of the symbols of A as well as the $F_2$-endomorphisms on A. By extended binary representation of an element of field A, we mean generally a redundant binary representation of this element using a number $\bar{p}$ of bits greater than (generally greater than $\log_2(q)$).

Each of the $\bar{p}$ bits of this extended binary representation is advantageously expressed as a linear combination of the p binary values of the binary representation with coefficients in $F_2$. For example, a symbol X from A could be represented by $(x_0, x_1, \ldots, x_{p-1})$ in the binary representation and by $(a_1, a_1, \ldots, a_{q-1})$ in the extended binary representation, with:

$$a_i = \sum_{j=0}^{p-1} s_i^j x_j, \quad s_i^j \in F_2 \quad (13)$$

where) $(s_1^0, s_1^1, \ldots, s_1^{p-1})$ $i=1, \ldots, q-1$ describe the q-1 possible combinations of p bits (q combinations excluding the zero combination). In this case, we have $\bar{p}=q-1$.

Relation (13) can also be expressed in matrix form:

$$(a_1, a_1, \ldots, a_{q-1}) = (x_0, x_1, \ldots, x_{p-1})S_p \tag{14}$$

where $S_p$ is the matrix of size $p \times (q-1)$ whose columns are q-1 possible combinations of p bits. In other words, $S_p$ is the generating matrix of the code $(a_1, a_1, \ldots, a_{q-1})$.

Any extended binary representation of A induces in canonical fashion an extended binary representation of endomorphisms on A. In face, let a vector $\mu_e$ of dimension $\bar{p}$ be an extended binary representation of an element $X \in A$, then $\phi(X)$ is an element of A which also has an extended binary representation, $v_e$. Endomorphism $\phi$ can thus be represented by a binary matrix of size $\bar{p} \times \bar{p}$.

A non-binary code with M constraints and N variables can then be described by an extended binary matrix $H_e \in M_{\bar{p},N\bar{p}}(F_2)$, of dimension $M\bar{p} \times N\bar{p}$.

We will consider an extended binary representation of a non-binary code $C \subset A^N$ where A is a set of size $q=2^p$ and consequently isomorphic with $F_2^p$. The non-binary code is defined by a matrix $H \in M_{M,n}(L)$ whose elements $h_{m,n} \in L$ are endomorphisms on A:

$$C = Ker(H) \subset A^N \tag{15}$$

$$= \left\{ (X_1, \ldots, X_N) \;\middle|\; \sum_{n=1}^{N} h_{m,n} X_n = 0, \; \forall m = 1, \ldots, M \right\}$$

Each of the M equations appearing in (15) corresponds to a constraint (that is, to a linear equation in the non-binary variables $X_n$). Matrix H is the "parity matrix" of non-binary code C.

Let $h \in L$ and $m_h \in M_p(F_2)$ be its binary image in the sense of isomorphism (6).

In concrete terms, if $p=3$ and if h is the endomorphism on A which creates, for each element X, a correspondence with element 3X, the binary image of h can be written, as we have seen above in connection with expressions (11) and (12):

$$m_h = \begin{pmatrix} 1 & 0 & 1 \\ 1 & 1 & 1 \\ 0 & 1 & 1 \end{pmatrix} \tag{16}$$

Returning to the general case, and considering the set $Z_q = \{0, 1, \ldots, q-1\}$ of integers modulo q, matrix $m_h \in M_p(F_2)$ induces an endomorphism $\phi_h$ on $Z_q$:

$$\begin{array}{ccc} F_2^p & \xrightarrow{m_h} & F_2^p \\ \eta \downarrow & & \downarrow \eta \\ Z_q & \xrightarrow{\phi_h} & Z_q \end{array} \tag{17}$$

where $\eta$ is the bijection which associates the integer $z=b_0+b_1 2^1+b_2 2^2+\ldots+b_{p-1} 2^{p-1}$ with each P-tuple $(b_0, b_1, \ldots, b_{p-1})$. Conversely $\eta^{-1}$ associates with each integer in $Z_q$ its binary decomposition on p bits.

The bitwise XOR operation on $F_2^p$ provides $Z_q$ with a vector $F_2$-space structure. The operation $\wedge$ is defined on $Z_q$ by:

$$i \wedge j = \eta(\eta^{-1}(i) \, XOR \, \eta^{-1}(j)) \tag{18}$$

$\phi_h$ then confirms the property:

$$\phi_h(i \wedge j) = \phi_h(i) \wedge \phi_h(j), \forall i,j \in Z_q \tag{19}$$

A matrix $M_h \in M_{q-1}(F_2)$ of size $(q-1) \times (q-1)$ is defined by:

$$M_h(i,j) = \begin{cases} 1, & \text{if } j = \phi_h(i) \\ 0, & \text{otherwise} \end{cases} \forall i, j \in Z_q^* \tag{20}$$

where $Z_q^* = Z_q - \{0\}$. This representation does not call upon the zero element of $Z_q$, because we have trivially $\phi_h(0)=0$.

Matrix $M_h$ is called the "extended binary matrix" associated with endomorphism $h \in L$. In the preceding definition, it is noted that set $Z_q^*$ is used only to index the rows and columns of matrix $M_h \in M_{q-1}(F_2)$ with integers $(i,j) \in Z_q \times Z_q$, rather than with symbols from alphabet A.

It is noted that if $h \in L$ is an invertible endomorphism (or equivalently, if $M_h \in M_p(F_2)$ is an invertible matrix), then $\phi_h$ induces a permutation on $Z_q$ and it follows that $M_h$ is a permutation matrix, containing only a single "1" per row and per column.

We will illustrate the construction of the extended binary matrix within the framework of the foregoing example $A=F_8$, $h=3 \in L$, recalling that its binary image is:

$$m_h = \begin{pmatrix} 1 & 0 & 1 \\ 1 & 1 & 1 \\ 0 & 1 & 1 \end{pmatrix}$$

The rows of $m_h$ respectively define $\phi(1)$, $\phi(2)$ and $\phi(4)$. Thus $\phi(1)=5$, the integer whose binary decomposition corresponds to the first row of $m_h$. Likewise, we have $\phi(2)=7$ and $\phi(4)=6$.

We deduce the values of the other elements of $Z_8$ indexing A using (19):

$$\phi(3)=\phi(1) \wedge \phi(2)=2$$

$$\phi(5)=\phi(1) \wedge \phi(4)=3$$

$$\phi(6)=\phi(2) \wedge \phi(4)=1 \tag{21}$$

Finally, the extended binary matrix $M_h$ associated with h is given by:

$$M_h = \begin{pmatrix} 0 & 0 & 0 & 0 & 1 & 0 & 0 \\ 0 & 0 & 0 & 0 & 0 & 0 & 1 \\ 0 & 1 & 0 & 0 & 0 & 0 & 0 \\ 0 & 0 & 0 & 0 & 0 & 1 & 0 \\ 0 & 0 & 1 & 0 & 0 & 0 & 0 \\ 1 & 0 & 0 & 0 & 0 & 0 & 0 \\ 0 & 0 & 0 & 1 & 0 & 0 & 0 \end{pmatrix} \tag{22}$$

We proceed thus for each of the $M \times N$ coefficients (that is for each of the endomorphisms) $h_{m,n} \in L$. The matrix obtained by replacing each element $h_{m,n}$ of $H \in M_{M,N}(L)$ by the associated extended binary matrix $M_h \in M_{q-1}(F_2)$, defined by (20), is a matrix denoted $\overline{H}_{bin} \in M_{M(q-1), N(q-1)}(F_2)$, called the extended binary matrix associated with the parity matrix H of non-binary code C.

Binary code $\overline{C}_{bin} = Ker(\overline{H}_{bin}) \subset F_2^{N(q-1)}$ is called the extended binary code associated with non-binary code C'Ker(H) $\subset A^N$.

FIG. 5 gives an example of a parity matrix H, of its binary image $H_{bin}$ and of its extended binary image $\overline{H}_{bin}$, constructed as described earlier. For the sake of simplification, only non-zero values have been shown in the latter image.

The parity matrix H is that of a non-binary LDPC code defined on $F_8$, with N=6 variables and M=3 checks.

Its binary image, $H_{bin}$, is a matrix of size 9×18, constructed based on 3×3 elementary matrices, each elementary matrix corresponding to a coefficient of H, that is an endomorphism on $F_8$, and giving a binary representation of it (as per (6)). Each matrix is "weighted" in the sense that the row and column numbers correspond to binary weights $2^0, 2^1, 2^2$.

Extended binary image $\overline{H}_{bin}$ is a matrix of size 21×42, constructed based on elementary matrices of size 7×7, each elementary matrix corresponding again to a coefficient of matrix H, that is an endomorphism on $F_8$, and giving an extended binary representation of it (as per (20)). Unlike the binary image, the rows and columns of the elementary matrices are not "weighted" here, but each corresponds to an element of $F_8$ (excluding the zero element).

It is noted that matrix $\overline{H}_{bin}$ is not very dense. In the present case, it contains only four nonzero ("1") values per line dispersed among 42. Consequently, the graph associated with this matrix shows noticeably fewer cycles than the binary image $H_{bin}$.

The words of non-binary code C can be expressed using the extended binary representation of the elements of A. In fact, let $(X_1, \ldots, X_N) \in C \subset A^N$ be a word of the non-binary code. $\forall n \in \{1, \ldots, N\}$, we denote $(x_{n,0}, x_{n,1}, \ldots, x_{n,p-1}) \in F_2^p$ the binary image or $X_n$ and $(a_{n,1}, a_{n,2}, \ldots, a_{n,q-1}) \in F_2^{q-1}$ its extended binary image, obtained by (14), that is:

$$(a_{n,1}, a_{n,2}, \ldots, a_{n,q-1}) = (x_{n,0}, x_{n,1}, \ldots, x_{n,p-1}) S_p \quad (23)$$

then $(a_{1,1}, a_{1,2}, \ldots, a_{1,q-1}, \ldots, a_{N,1}, a_{N,2}, \ldots, a_{N,q-1}) \in \overline{C}_{bin} \subset F_2^{N(q-1)}$. In what follows, we will denote by the the binary code whose generating matrix is $S^p$.

Conversely, let the binary sequence:

$$(a_{1,1}, a_{1,2}, \ldots, a_{1,q-1}, \ldots, a_{N,1}, a_{N,2}, \ldots, a_{N,q-1}) \in \overline{C}_{bin} \subset F_2^{N(q-1)} \quad (24)$$

be such that $\forall n \in \{1, \ldots, N\}, (a_{n,1}, a_{n,2}, \ldots, a_{n,q-1}) \in S_p \subset F_2^{q-1}$, in others words, such that:

$$\exists (x_{n,0}, x_{n,1}, \ldots, x_{n,p-1}) \in F_2^p \text{ such that } (a_{n,1}, a_{n,2}, \ldots, a_{n,q-1}) = (x_{n,0}, x_{n,1}, \ldots, x_{n,p-1}) S_p$$

Let $X_n \in A$, be the symbol whose binary image is $(x_{n,0}, x_{n,1}, \ldots, x_{n,p-1}) \in F_2^p$. Then $(X_1, \ldots, X_N) \in C \subset A^N$ is a non-binary codeword and $(a_{n,1}, a_{n,2}, \ldots, a_{n,q-1}) \in F_2^{q-1}$ is the extended binary image of $X_n$, for all n E$\in \{1, \ldots, N\}$. As a result, the application that associates a non-binary codeword $(X_1, \ldots, X_N) \in C$ with its extended binary image $(a_{1,1}, a_{1,2}, \ldots, a_{1,q-1}, \ldots, a_{N,1}, a_{N,2}, \ldots, a_{N,q-1}) \in \overline{C}_{bin}$ is an isomorphism of C on $\overline{C}_{bin} \cap S_p^N$ where $S_p^N = S_p \times \ldots \times S_p \cap F_2^{N(q-1)}$ is the vector space obtained as the Cartesian product of N copies of $S_p$.

We will give hereafter a simple example of extended binary representation of a non-binary code. Let the non-binary code be defined on $A=F_8$ by the single parity equation (7). We have p=3 and q=8. Matrix $S_3$ is defined by:

$$S_3 = \begin{pmatrix} 1 & 0 & 1 & 0 & 1 & 0 & 1 \\ 0 & 1 & 1 & 0 & 0 & 1 & 1 \\ 0 & 0 & 0 & 1 & 1 & 1 & 1 \end{pmatrix} \quad (25)$$

The extended binary representation $(a_1, a_2, \ldots, a_7)$ of an element X in A can be obtained from its binary representation $(x_0, x_1, x_2)$ by means of $(a_1, a_2, \ldots, a_7) = (x_0, x_1, x_1) S_3$, or further:

$$a_1 = x_0, a_2 = x_1, a_3 = x_0 + x_1, a_4 = x_2, a_5 = x_0 + x_2, a_6 = x_1 + x_2,$$
$$a_7 = x_0 + x_1 + x_2 \quad (26)$$

It will be understood that variables $a_1, a_2, \ldots, a_7$ represent the possible linear $F_2$-combinations of binary values $x_0, x_1, x_2$.

The extended binary representation $(b_1, b_2, \ldots, b_7)$ of Y and that of Z, $(c_1, c_2, \ldots, c_7)$, is obtained in the same way, to with $(b_1, b_2, \ldots, b_7) = (y_0, y_1, y_2, \ldots, y_7) S_3$ and $(c_1, c_2, \ldots, c_7) = (z_0, z_1, z_2) S_3$.

System of equations (10) can then be re-written in the form:

$$\begin{cases} (x_0 + x_2) + y_1 + (z_1 + z_2) = 0 \\ (x_0 + x_1 + x_2) + (y_1 + y_2) + (z_0 + z_1) = 0 \\ (x_1 + x_2) + (y_0 + y_2) + (z_0 + z_1 + z_2) = 0 \end{cases} \quad (27)$$

or equivalently, by calling on the extended binary representation:

$$\begin{cases} a_5 + b_2 + c_6 = 0 \\ a_7 + b_6 + c_5 = 0 \\ a_6 + b_5 + c_7 = 0 \end{cases} \quad (28)$$

which gives in matrix form:

$$\begin{pmatrix} 0 & 0 & 0 & 0 & 1 & 0 & 0 & | & 0 & 1 & 0 & 0 & 0 & 0 & 0 & | & 0 & 0 & 0 & 0 & 0 & 1 & 0 \\ 0 & 0 & 0 & 0 & 0 & 0 & 1 & | & 0 & 0 & 0 & 0 & 0 & 1 & 0 & | & 0 & 0 & 0 & 0 & 1 & 0 & 0 \\ 0 & 0 & 0 & 0 & 0 & 1 & 0 & | & 0 & 0 & 0 & 0 & 1 & 0 & 0 & | & 0 & 0 & 0 & 0 & 0 & 0 & 1 \end{pmatrix} u = 0 \quad (29)$$

where $u = (a_1, \ldots, a_7, b_1, \ldots, b_7, c_1, \ldots, c_7)$. $\in \overline{C}_{bin}$. This matrix contains 3 elementary matrices, each corresponding to an endomorphism on $F_8$ (the coefficients of the nonlinear code) and three rows corresponding to the three equations of system (28).

It is noted that the foregoing matrix does not define any parity check for certain bits of the extended binary representation of X,Y,Z. In order for each of the 21 bits to participate in a parity check, additional rows are added to this matrix which can be deduced from linear combinations of the rows already present. Thus for example, by adding the first two rows of matrix (29), or equivalently by adding in the first two equations of system (28), we obtain:

$$(a_5 + a_7) + (b_2 + b_6) + (c_5 + c_6) = 0 \quad (30)$$

which considering that $(a_5 + a_7 = x_0 + x_2 + x_0 + x_1 + x_2 = x_1 = a_2$, $b_2 + b_6 = b_4$ and $c_5 + c_6 = c_3$, can be re-written as row no. 3 of the matrix:

$$a_2 + b_4 + c_3 = 0 \quad (31)$$

Similarly, by adding rows no. 1 and no. 4, we obtain row no. 5:

$$a_3 + b_7 + c_1 = 0 \quad (32)$$

by adding rows no. 2 and no. 4, we obtain row no. 6:

$$a_1 + b_3 + c_2 = 0 \quad (33)$$

and finally, by adding rows 1, 2 and 4, we obtain a row 7:

$$a_4+b_1+c_4=0 \qquad (34)$$

Ultimately, the matrix thus completed is none other than the extended binary matrix $\overline{H}_{bin}$:

$$(35)$$

$$\overline{H}_{bin} = \begin{pmatrix} 0 & 0 & 0 & 0 & 1 & 0 & 0 & | & 0 & 1 & 0 & 0 & 0 & 0 & 0 & | & 0 & 0 & 0 & 0 & 0 & 1 & 0 \\ 0 & 0 & 0 & 0 & 0 & 0 & 1 & | & 0 & 0 & 0 & 0 & 0 & 1 & 0 & | & 0 & 0 & 0 & 0 & 1 & 0 & 0 \\ 0 & 1 & 0 & 0 & 0 & 0 & 0 & | & 0 & 0 & 0 & 1 & 0 & 0 & 0 & | & 0 & 0 & 1 & 0 & 0 & 0 & 0 \\ 0 & 0 & 0 & 0 & 0 & 1 & 0 & | & 0 & 0 & 0 & 0 & 1 & 0 & 0 & | & 0 & 0 & 0 & 0 & 0 & 0 & 1 \\ 0 & 0 & 1 & 0 & 0 & 0 & 0 & | & 0 & 0 & 0 & 0 & 0 & 0 & 1 & | & 1 & 0 & 0 & 0 & 0 & 0 & 0 \\ 1 & 0 & 0 & 0 & 0 & 0 & 0 & | & 0 & 0 & 1 & 0 & 0 & 0 & 0 & | & 0 & 1 & 0 & 0 & 0 & 0 & 0 \\ 0 & 0 & 0 & 1 & 0 & 0 & 0 & | & 1 & 0 & 0 & 0 & 0 & 0 & 0 & | & 0 & 0 & 0 & 1 & 0 & 0 & 0 \end{pmatrix}$$

The bipartite graph associated with this parity matrix does not contain any cycles, each bit $a_1$, $b_1$ or $c_1$ appearing only in a single parity check. Generally, an extended binary matrix $\overline{H}_{bin}$ contains cycles only to the extent that the non-binary matrix H itself contains some: cycles appearing in $\overline{H}_{bin}$ are in fact induced by cycles already present in H.

After giving an extended binary representation of the non-binary code, we will hereafter disclose the decoding method according to the invention that implements this representation.

Figure 6:
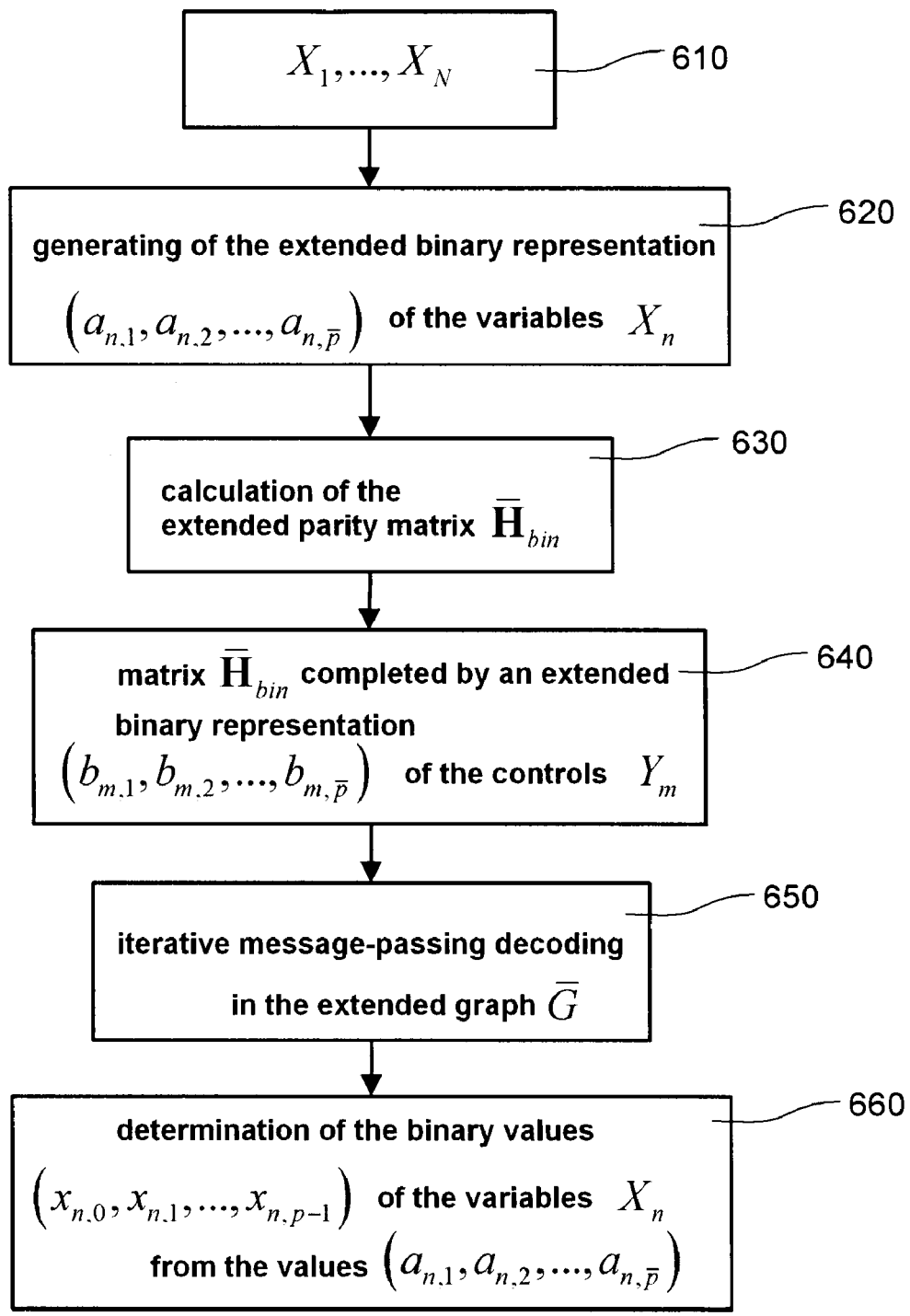
FIG. 6 shows schematically a decoding method for a non-binary code using an extended binary representation, according to one embodiment of the invention.

FIG. 6 represents schematically as a flowchart a decoding method for a non-binary code according to one embodiment of the invention.

As before, we consider a non-binary error-correction code C, amenable to representation by a bipartite graph G, the code being defined by a set of N variables $X_1, \ldots, X_N$ drawing their values from a non-binary alphabet A, and a set of M constraints linearly dependent on said variables by means of a matrix of constraints H made up of coefficients in L. We denote that q=Card(A) and p the smallest integer such that $p \geq \log_2(q)$, in other words p is the smallest number of bits that allows a binary representation of the symbols of A.

The values of the variables $X_1, \ldots, X_N$ are taken into account in step 610. These values can be received from a transmitter through a communication channel or read from a recording medium. More specifically, each variable $X_n$ is represented by p binary values $x_{n,0}, x_{n,1}, \ldots, x_{n,p}$ where $x_{n,0}$ is the LSB and $x_{n,p}$ is the MSB. These binary values may be inherently hard or soft in known fashion. Likewise each non-binary constraint $Y_m$ corresponds to p parity checks $y_{m,0}, y_{m,1}, \ldots, y_{m,p}$ which must be confirmed by binary values $x_{n,0}, x_{n,1}, \ldots, x_{n,p}$.

Furthermore, the constraint matrix H is known to the decoder.

At step 620, there is generated for each variable $X_n$ an extended binary representation $(a_{n,1}, \ldots, a_{n,\bar{p}})$ of $X_n$ by means of a plurality $\bar{p}$ of distinct linear combinations with coefficients from $F_2$ of its binary values $x_{n,0}, x_{n,1}, \ldots, x_{n,p}$, such that $\bar{p} > p$. Values $a_{n,q}, \ldots, a_{n,\bar{p}}$ are called the binary values of the extended binary representation of $X_n$ or, more simply, extended binary values of $X_n$. It is possible to generate this way up to q−1 extended binary values.

At step 630, an extended parity matrix $\overline{H}_{bin}$ is calculated, making it possible to obtain the parity checks associated with each (non-binary) constraint based on the extended binary values of the different variables $X_1, \ldots, X_N$. The checks thus obtained are called extended parity checks.

At step 640, parity matrix $\overline{H}_{bin}$ is completed, advantageously but not necessarily, by adding additional rows, said additional rows being obtained by means of distinct linear combinations, using coefficients in $F_2$, of the existing rows, excluding the zero combination. It is also possible to add up to q−p−1 additional rows to obtain a total of q−1 rows per constraint, each row of the matrix thus completed being associated with an extended parity check, that is applying to extended binary values of the variables.

More generally, one can obtain a parity matrix $\overline{H}_{bin}$ from $\bar{p}$ distinct linear combinations per constraint, each one of them being a combination, using coefficients in $F_2$, of the existing rows (excluding the zero combination). These combinations need not include some existing rows, or even all of them.

At step 650, an iterative message-passing decoding process is carried out by means of a bipartite graph $\overline{G}$ connecting the extended binary values of the variables to the extended binary values of the checks. Messages exchanged between variable vertices and check vertices can be probabilities, log likelihood ratios (LLRs), or simply binary values. Messages can be calculated in inherently known fashion using algorithms of the "sum-product" or "min-sum" type, or even their corrected variants "normalized min-sum," "self-corrected min-sum." For example, a description of the first two types mentioned can be found in the thesis by N. Wiberg cited earlier. For the "normalized min-sum" variant, one can refer in particular to the paper by J. Chen et al entitled "Near Optimum universal belief propagation based decoding of low density parity check codes," IEEE Trans. on Comm., vol. 50(3), pages 406-414, 2002. For the "Self-corrected Min-Sum" variant, one can refer to the paper by V. Savin entitled "Self-Corrected Min-Sum of LDPC codes," IEEE Int. Symp. on Information Theory (ISIT), Toronto, Canada, 2008.

Iterative decoding continues until a stopping criterion is confirmed (parity checks confirmed, maximum number of iterations reached, absolute values of LLRs passing a threshold value, etc.)

At step 660, the binary values of each variable are finally determined from its extended binary values thus obtained.

Figure 7:
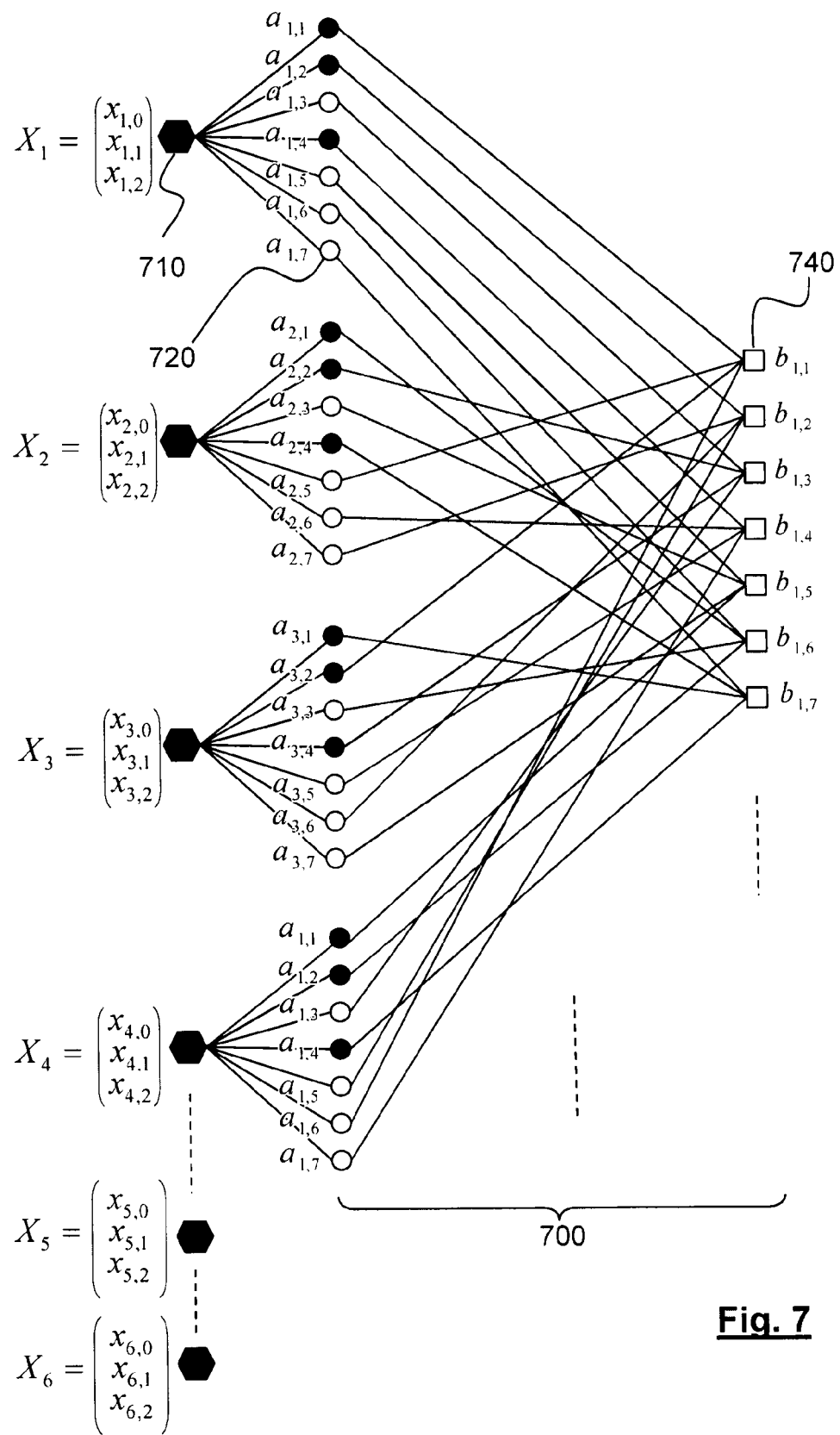
FIG. 7 represents a first example of a bipartite graph associated with an extended binary representation of a non-binary code and allowing decoding according to the method of FIG. 6.

FIG. 7 shows an example of a bipartite graph $\overline{G}$ associated with an extended binary representation of non-binary code C and allowing decoding according to the method of FIG. 6.

The example shown is that of the non-binary code defined on alphabet $A=F_8$ by the parity matrix H given in (1). Here we have q=8 and p=3, N=6 and M=3. Variables are denoted $X_1, X_2, \ldots, X_6$ and constraints are denoted $Y_1, Y_2, Y_3$. Every variable is an element of $F_8$.

Each variable $X_n$ is represented by its binary image, to with three binary values $(x_{n,0}, x_{n,1}, x_{n,2})$. Each constraint $Y_m$ is represented by its binary image, to with three extended parity checks $(y_{m,0}, y_{m,1}, y_{m,2})$.

In the example shown, the representation of the variables has been extended to the maximum number of bits, to with q−1=7 bits (in other words, $\bar{p}=7$). Similarly, the representation of the constraints has been extended to the maximum number of extended checks. The extended binary representation of variable $X_n$ is denoted thus: $(a_{n,1}, a_{n,2}, \ldots, q_{n,7})$ and that of $Y_m$ is denoted $(b_{m,1}, b_{m,2}, \ldots, b_{m,7})$.

The extended representation is obtained in the following manner:

for the variables $X_n$ $$a_{n,1}=x_{n,0}$$

$$a_{n,2}=x_{n,1}$$

$$a_{n,3}=x_{n,0}+x_{n,1}$$

$$a_{n,4}=x_{n,2}$$

$$a_{n,5} = x_{n,0} + x_{n,2}$$

$$a_{n,6} = x_{n,1} + x_{n,2}$$

$$a_{n,7} = x_{n,0} + x_{n,1} + x_{n,2} \quad (36)$$

Thus, we see that each bit of the extended binary representation of a variable is expressed as a combination of its binary values.

for the constraints $Y_m$ $$b_{m,1} = y_{m,0}$$

$$b_{m,2} = y_{m,1}$$

$$b_{m,3} = y_{m,0} + y_{m,1}$$

$$b_{m,4} = y_{m,2}$$

$$b_{m,5} = y_{m,0} + y_{m,2}$$

$$b_{m,6} = y_{m,1} + y_{m,2}$$

$$b_{m,7} = y_{m,0} + y_{m,1} + y_{m,2} \quad (37)$$

We see that each extended parity check is expressed as a linear combination of parity checks of the binary image of this constraint.

Matrix $\overline{H}_{bin}$, whose rows correspond to the extended parity checks $b_{j,m}$ is of size M(q−1)×N(q−1), that is to say 21×42. This matrix is given in FIG. 5.

On the graph of FIG. 7, variables are shown as hexagons, the extended binary values of the variables by circles, and the extended parity checks by squares.

Only the part of the graph corresponding to check $Y_1$ has been shown so as not to overload the figure. Of course, the extended binary checks representing constraints $Y_2$ and $Y_3$ are also connected to the extended binary values of the variable vertices, but the corresponding edges are not shown.

The initial values of the variables used to initialize decoding are shown grayed. More specifically, binary values $x_{n,0}$, $x_{n,1}, x_{n,2}$ are used to respectively initialize extended binary values $a_{n,1}, a_{n,2}, a_{n,4}$. The other extended binary values can be considered as erasures, that is as unknowns (probability value equal to 0.5 for example, or LLR value equal to 0). According to one variant, the other extended binary values are also initialized using equation (36) above.

After iterative message-passing decoding, the decoded binary values of the variables $X_1, X_2, \ldots, X_6$ are obtained from:

$$x_{n,1} = a_{n,2'} \quad (38)$$

in other words, we have simply recovered the binary values from the extended binary values in a way that mirrors the initialization step.

It will be understood that the extended binary representation of the variables does not necessarily include all linear $F_2$-combinations of the binary values of those variables. Likewise, the extended binary representation of the constraints does not necessarily include all the linear $F_2$-combinations of the parity checks associated with those constraints.

In any case, the use of a representation extended over $\overline{p} > p$ binary values for the variables and/or $\overline{p}' > p$ parity equations makes it possible to obtain a matrix with a lower density and a bipartite graph showing a smaller number of cycles. It will be noted that, generally, the number $\overline{p}'$ of parity equations of matrix $\overline{H}_{bin}$ can be different from $\overline{p}$.

In the embodiment described previously, variable vertices 710 (non-binary symbols) and 720 (binary symbols) pass messages only during the initialization phase and during the decoded values recovery phase, at the end of the iterative decoding process.

One can use to advantage the fact that the extended binary values $a_{n,q}, a_{n,2}, \ldots, a_{n,q-1}$ form a codeword of $S_p$, or of a shortened codeword when the number of extended binary values confirms $\overline{p} < q-1$ (in this case only $\overline{p}$ values $a_{n,1}$ of $a_{n,1}$, $a_{n,2}, \ldots, a_{n,q-1}$ are taken into account).

According to a first variant of the first embodiment, we check periodically, or upon satisfaction of a criterion, that the extended binary values actually confirm the code constraints (for example $a_{n,1} + a_{n,2} = a_{n,3}$). If this is not the case, we can search for the codeword $\hat{a}_{n,1}, \hat{a}_{n,2}, \ldots, \hat{a}_{n,q-1}$ in $S_p$ that is closest to $a_{n,1}, a_{n,2}, \ldots a_{n,q-1}$ according to a certain metric (a Hamming metric, for instance) or equivalently in the probability sense, which comes down to decoding the codeword in the sense of the maximum-likelihood criterion. The word $a_{n,1}$, $a_{n,2}, \ldots, a_{n,q-1}$ is then replaced with $\hat{a}_{n,1}, \hat{a}_{n,2}, \ldots, \hat{a}_{n,q-1}$ and the iterative decoding is continued. This variant also finds application when a shortened code $S_p$ is considered, the constraints then applying extended binary values $a_{n,1}, a_{n,2}, \ldots, a_{n,q-1}$ to a subset of $\overline{p}$.

According to a second variant, we take advantage of the fact that the constraints applying to the extended binary variables ($a_{n,1}, a_{n,2}, \ldots, a_{n,q-1}$ being required to be a word in code $S_p$) also apply to the messages, that is to say to the extrinsic information that these binary values transmit to the check vertices. Messages corrected in the ML sense are then determined to satisfy these constraints, and these corrected messages are used in the place of the aforementioned messages for the following step in the iterative decoding. Here an a posteriori correction is involved. The conclusion is still valid when a shortened code is considered.

According to a third variant, we take advantage of the fact that the constraints that apply to the extended binary variables ($a_{n,1}, a_{n,2}, \ldots, a_{n,q-1}$ being required to be a word in code $S_p$) also apply to the messages received by them, in other words the intrinsic information transmitted to them by the check vertices. The messages then received are corrected in the ML sense as before to satisfy these constraints, and are then used to determine the messages to be transmitted on to the check vertices. The conclusion is still valid when a shortened code is considered.

In all of these variants, it is understood that the variable vertices (represented by hexagons) can then be interpreted as additional constraints (confirmation or not of the shortened code $S_p$).

Figure 8:
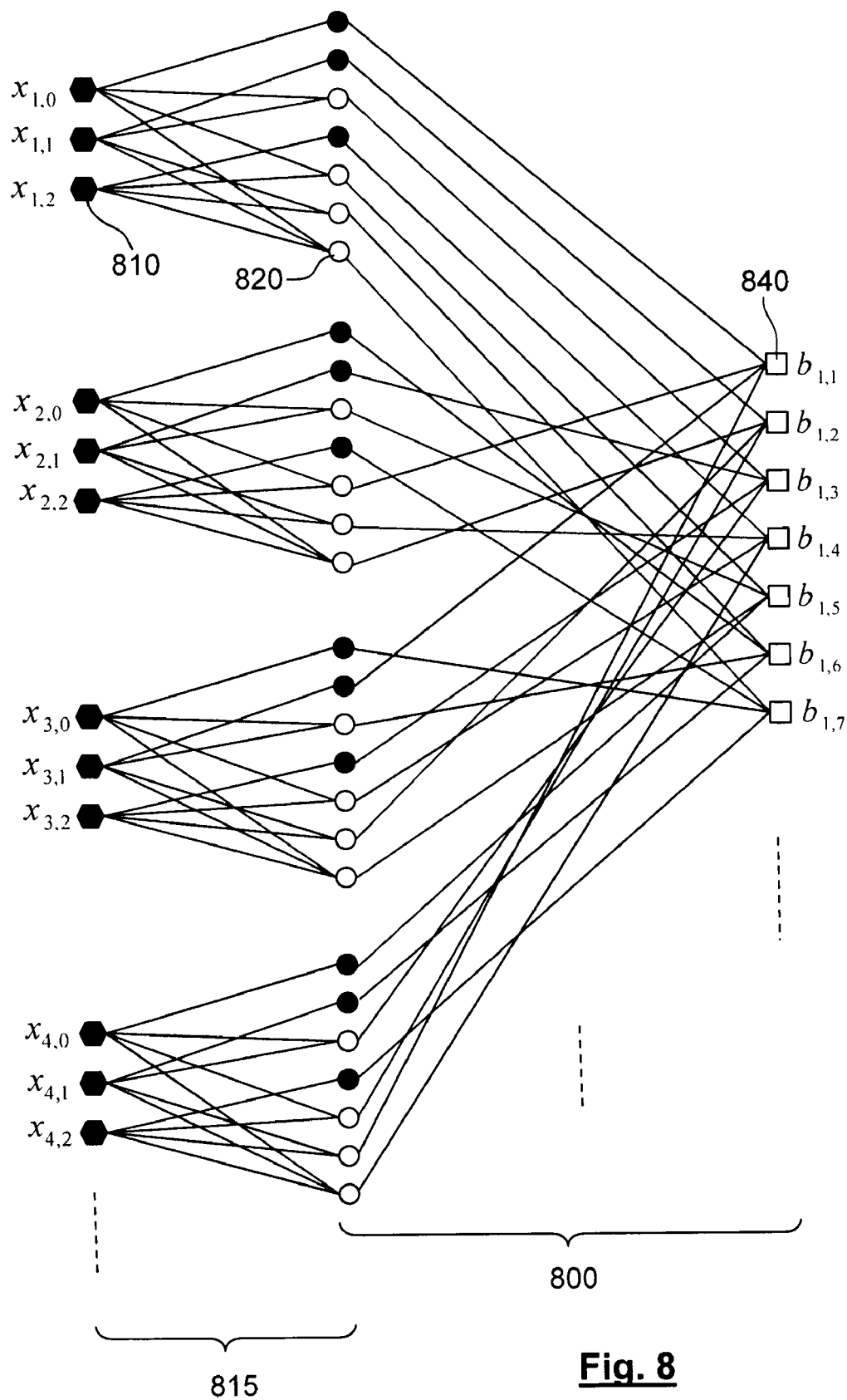
FIG. 8 represents a second example of a bipartite graph associated with the same extended binary representation of the non-binary code and also allowing decoding according to the method of FIG. 6.

FIG. 8 shows another example of a bipartite graph of the same non-binary code.

The vertices associated with the binary values of each variable have been labeled 810. Labels 820 and 840 are respectively identical to labels 720 and 740 of FIG. 7.

The graph connecting the binary values and the extended binary values of the variables is designated 815. This graph represents the $\overline{p}$ linear combinations which enables passing from the first to the second. In what follows, graph 815 will be called the auxiliary graph of extended graph 800.

The iterative decoding step includes at least a first phase of message passing between the binary values and the extended binary values of the variables, through auxiliary graph 815, and a second phase of message passing between the extended binary values of the variables and the extended checks, through graph 800.

We thus have a three-level message passing cycle (810→820→840→820→810).

Other message passing strategies can be conceived by a person skilled in the art without departing from the scope of the present invention.

The present invention is also defined by a transmitter and an associated method for transmitting a non-binary code amenable to representation by a bipartite graph, in particular a non-binary LDPC code, according to the quality of the transmission channel.

More specifically, we will consider in the following a non binary code C constituted by codewords, each codeword $(X_1 X_2, \ldots, X_N) \in C$ being an N-uplet of elements of the alphabet A, with Card(A)=$2^p$, meeting the constraints of the code. For the sake of simplification and without prejudice of generalization we will assume in the following that For each non binary symbol $X_n \in A$, we denote $(x_{n,0}, x_{n,1}, \ldots, x_{n,p-1}) \in F_2^p$ the binary representation (also called binary image) of $X_n$ and $(a_{n,1}, a_{n,2}, \ldots, a_{n,q-1}) \in F_2^{q-1}$ its extended binary representation (also called extended binary image), as obtained by (23). The bits of the extended binary image are called hereinafter extended bits. The extended bits having the form $x_{n,1} = a_{n,2^i}$, i=0, ..., p-1, namely the bits also belonging to the binary image are called trivial extended bits whereas the other bits are called true extended bits.

The idea at the basis of the invention is to send over the transmission channel part or whole of the extended binary image of the non binary symbols, depending upon the quality of the channel.

Figure 9:
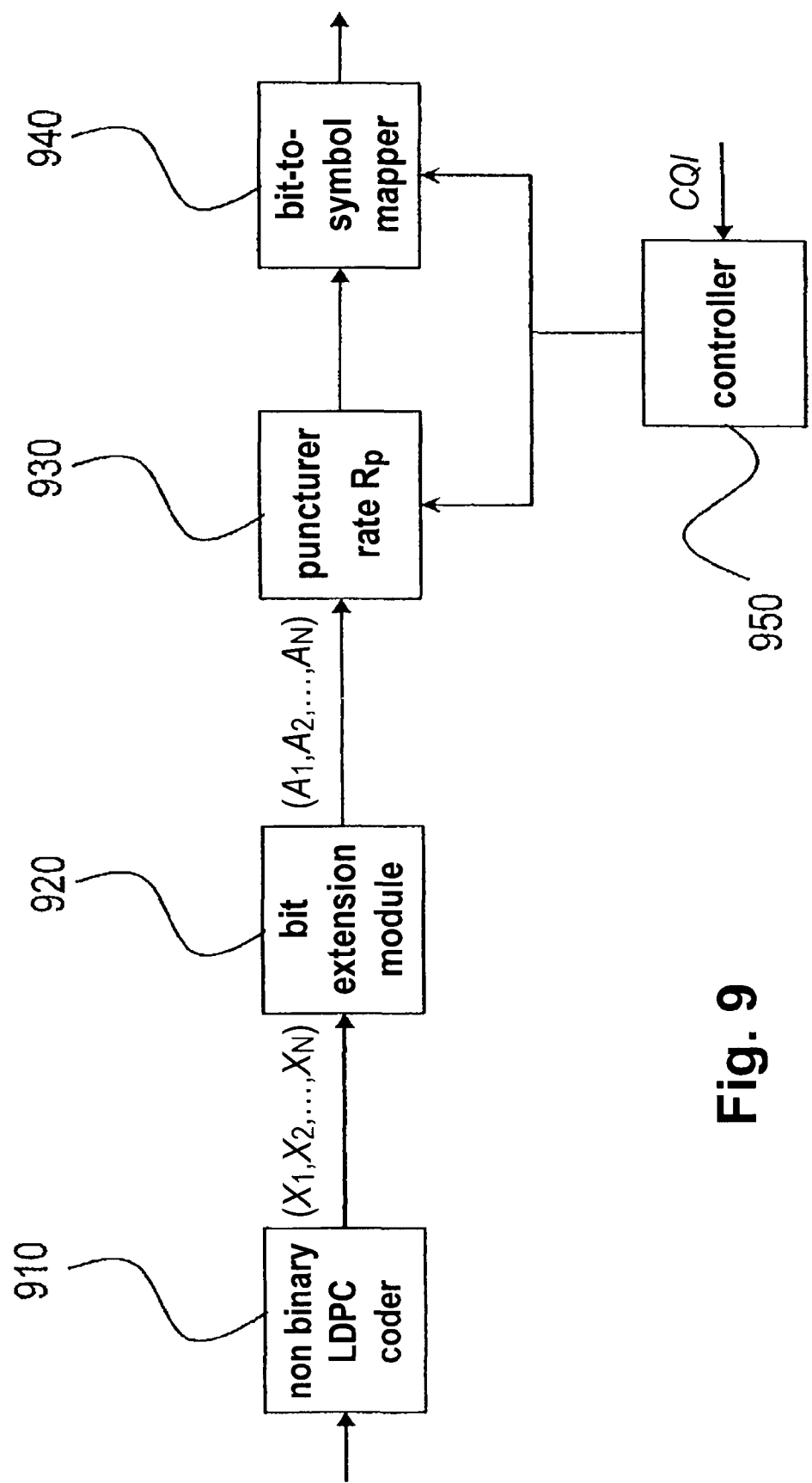
FIG. 9 shows schematically the structure of a transmitter according to an embodiment of the invention.

FIG. 9 shows an embodiment of a transmitter carrying out a method of transmission according to an embodiment of the invention.

The transmitter comprises a non binary coder 910, e.g. a non-binary LDPC coder transforming each packet of information symbols into a codeword of non binary symbols ($X_1$, $X_2$, ..., $X_N$) meeting the code constraints. More specifically, the coder 910 outputs the binary image (p bits) of each non-binary symbol $X_n$, n=1, ..., N.

The extension module, 920, extends the binary image of each non binary symbols i.e. it calculates true extended bits according to (23). It should be noted that the extension module does not necessarily generate all the extended bits, that is the q−1 (q=$2^p$) possible combinations except the zero combination. In general, a number of $\tilde{p}$ combinations is generated with $p < \tilde{p} \leq q-1$. For the sake of simplification however, we will assume in the following that $\tilde{p}=q-1$, without prejudice of generalization.

The extended binary image of the non binary symbols is punctured by puncturer 930. More specifically, the extended binary image of the codeword, $(A_1, A_2, \ldots, A_N)$, is made up by the respective extended binary images of the non binary symbols:

$$(a_{1,1}, a_{1,2}, \ldots, a_{1,q-1}), (a_{2,1}, a_{2,2}, \ldots, a_{2,q-1}), \ldots, (a_{N,1}, a_{N,2}, \ldots, a_{N,q-1}) \quad (39)$$

The puncturer 930 removes some of the extended bits $a_{n,1}$, $a_{n,2}, \ldots, a_{n,q-1}$, n=1, ..., N from the sequence (39). These bits are removed according to a puncturing pattern output by controlling means 950. The puncturing pattern can be defined for example by an N(q−1)-bit word (in general an N$\tilde{p}$ word) where a "0" indicates that the corresponding bit of the sequence is punctured and a "1" that it is retained.

The puncturing pattern need not necessarily be identical for each and every non binary symbol $X_n$ in a codeword. For example, the puncturing rate may differ from one non binary symbol to the other. Furthermore, the puncturing rate may differ from one codeword to another.

For a given codeword represented by a binary image of Np bits, the Np trivial extended bits are preferably not punctured and some or all remaining N(q−p−1) (in general N($\tilde{p}$−p)) true extended bits are punctured. The number of true extended bits left non punctured in a codeword is denoted E. The puncturing rate $R_p$ varies therefore here from 0 to (1−p/q). The selection of the bits to be punctured among the true extended bits may be carried out at random. Alternatively, the puncturing is carried out uniformly or non-uniformly over the symbols of a codeword. Advantageously, if the LDPC code is regular, that is if each and every non binary symbol of the codeword is involved in the same number of checks, the puncturing is uniform, in other words, the puncturing pattern will be the same for each non-binary symbol of a codeword. Conversely, if the LDPC code is irregular, the extended bits related to variables involved in a lesser number of checks are preferably less punctured than those related to variables involved in a larger number of checks. Indeed, if a non-binary symbol is involved in large number of checks it is generally better protected than otherwise. Simulations may be carried out in order to determine the optimum puncturing pattern for a given LDPC code at a given puncturing rate.

The selection of the punctured bits may even be refined at the symbol level. More specifically, the true extended bits involving more bits of the binary image (i.e. related to a higher number of "1" in the corresponding column of the generator matrix $S_p$) are more useful that those involving a lesser number of such bits. The latter extended bits are therefore punctured in priority with respect to the former.

In operation, the puncturing rate and, hence the puncturing pattern, is selected by the controlling means 950, according to the quality of the transmission channel, given by a channel quality indicator, CQI.

If the transmission channel is constituted by a plurality of transmission resources or sub-channels, e.g. sub-bands of an OFDM multiplex, the CQI may be a composite indicator, i.e. it may give the quality of the various sub-channels. In that instance, the extended binary image of the codewords or the symbols which are transmitted over a sub-channel of poorer quality will be less punctured that a sub-channel of higher quality.

After puncturing the sequence of extended bits is forwarded to a bit-to-symbol mapper, 940, adapted to map a plurality of bits into a symbol of a modulation constellation e.g. a $2^m$-QAM constellation. Optionally, the sequence of extended bits is interleaved in an interleaver (not shown) prior to be forwarded to mapper 940.

Advantageously, the mapper 940 is adaptive, that is the modulation scheme e.g. the order of modulation is controlled by controlling means 950, a more robust constellation (e.g. a lower order constellation) being selected where the quality of the transmission channel is poor and a less robust constellation (e.g. a higher order constellation) being selected where the quality of the transmission channel is high. If the CQI is composite as mentioned above, different modulation schemes may be selected for different sub-channels.

It will be appreciated by the man skilled in the art that the adaptive puncturer and mapper perform together an adaptive modulation and coding (AMC), the modulation and coding scheme (MCS) being dependent upon the CQI.

Advantageously, if the cardinal of the selected constellation is $2^m$ (for example a $2^m$-QAM constellation), the number of retained (non-punctured) extended bits per symbol is chosen such as e=m−p. In such instance the p bits of the binary image and the e=m−p retained true extended bits are mapped into one single constellation symbol. A non binary symbol of the LDPC code is then protected twice: first, by the coding (provision of e=m−p extended bits) and, second, by the modulation itself as only $2^p$ states among the $2^m$ states of the constellation symbol are allowed.

The transmitter described above can be used in a so-called IR-HARQ (Hybrid Automatic Repeat request with Incremental Redundancy) communication system. In such a system, the transmitter would first transmit a packet coded with a non-binary LDPC code while using the highest available puncturing rate. If decoding fails at the receiver, the transmitter would then transmit some of the extended bits punctured at the first transmission attempt. This process can be iterated, the extended bits being then transmitted by increments to the receiver until the decoding succeeds or until they are all sent.

The transmitter described above may also be used in a broadcasting system. In such a case, no retransmission of packets or increments may take place. It is therefore proposed to send first the binary image of a non-binary LDPC encoded packet, followed by the true extended bits, punctured at a desired rate. The users experiencing good transmission conditions would then be able to successfully decode the binary image without waiting for the reception of the extended bits, whereas users experiencing poor transmission conditions could rely on the extended bits for the decoding, at the expense of an additional latency, though.

Figure 10:
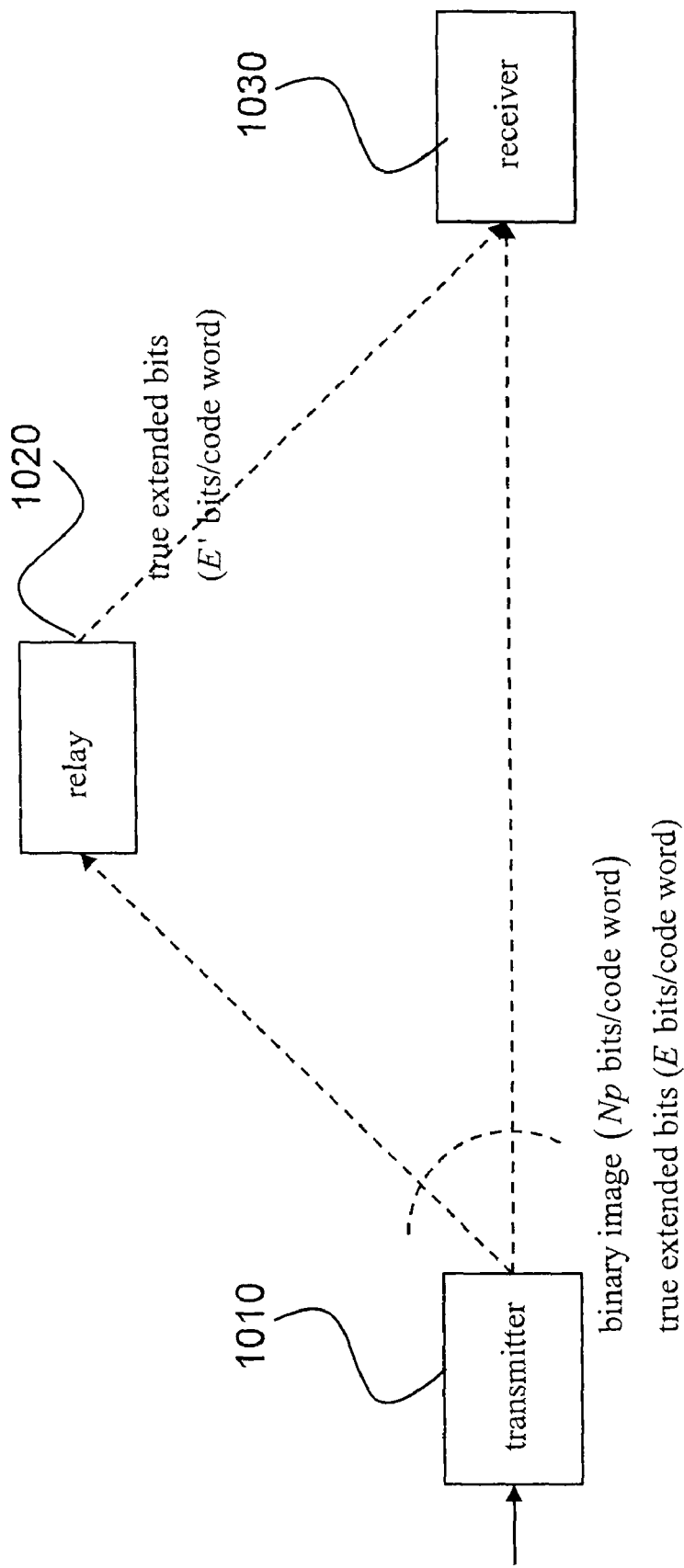
FIG. 10 shows schematically a cooperative communication system according to an embodiment of the invention.

FIG. 10 schematically shows a cooperative communication system according to an embodiment of the invention.

This system comprises a transmitter 1010 using a non-binary code, e.g. a LDPC non-binary code, at least one relay 1020 and a receiver 1030.

According to a first variant, the transmitter is conventional, namely it transmits only the binary image of the non-binary symbols of the LDPC code. The relay uses the received binary image to iteratively decode the non-binary symbols i.e. the variables of the LDPC code. The relay then generates an extended binary image of the non-binary symbols thus decoded and transmits some or all the extended bits to the receiver. Similar to the transmitter described above, the relay may systematically send the Np trivial extended bits of the non-binary symbols of a codeword together with E true extended bits which are not punctured. For each codeword, the Np bits of the binary image sent by the transmitter may be bit by bit combined (e.g. by Chase Combining) with the Np bits of the binary image sent by the relay. The E extended bits are additionally used by the receiver for decoding the codeword as explained further below.

According to a second variant, the transmitter has the structure already described in relation with FIG. 9. In such instance, the relay decodes the codeword and generates again $\bar{p}$ extended bits for each non-binary symbol. The set of the extended bits generated by the relay may be identical to the set of extended bits generated by the transmitter. Preferably, however, these two sets are disjoint or at least different.

Typically, for a given codeword, the transmitter sends the Np bits of the binary image together with E true extended bits (non punctured by the transmitter) and the relay sends E' other true extended bits (non punctured by the relay). The receiver uses the Np trivial extended bits and the E+E' true extended bits to decode the codeword as explained further below. In that instance, the man skilled in the art will understand that an increment of redundancy is sent by the relay along with the transmitter (spatially distributed IR).

Whatever the implementation of the transmitter and the presence of a relay, the receiver obtains after demapping (and possibly Chase combining), a set of Np+E bits per codeword, where E represents here the total number of true extended bits sent by the transmitter and, should the case occur, the relay. These Np+E bits are used for initializing the variables of the LDPC decoder as represented in FIG. 7 or 8. More specifically, in addition to the grey Np circles representing the initialized binary image of the variables, E additional circles representing true extended bits of those variables in the bipartite graph are also initialized. The remaining Nq−(Np+E) extended bits are considered as erasures (e.g. their initial LLRs are set to zero).

In case of an IR-HARQ system, if the decoding fails or does not converge after a predetermined number of iterations, additional true extended bits may be forwarded by the transmitter and/or the relay. These values are used for initializing some of Nq−(Np+E) previously considered as erasures and a second decoding attempt is performed again. The process may be repeated, the population of initialized bits (grayed circles on the left-hand part of the graph) increasing at each decoding attempt.

The invention claimed is:

1. A decoding method for non-binary codes, in particular for non-binary LDPC codes, amenable to representation by a bipartite graph with N variable vertices and M constraint vertices, the variables drawing their values from a non-binary alphabet A and being linearly constrained by means of a constraint matrix (H), each variable being represented by a plurality p of binary values, wherein:
   a plurality $\bar{p}>p$ of binary values, called extended binary values, is generated for each variable, obtained by $\bar{p}$ linear combinations with coefficients from $F_2$ of said p binary values, excluding the zero combination, wherein $F_2$ is a two element Galois field;
   a parity matrix is calculated, called the extended parity matrix, representing parity checks on the extended binary values of the variables, called extended parity checks, said extended parity checks being induced by the constraints on said variables;
   an iterative message-passing decoding process is carried out with the use of a second bipartite graph, called an extended graph, representing the extended parity matrix and connecting the extended parity checks with the extended binary values of the variables;
   the binary values of each variable are determined from its extended binary values, obtained at the conclusion of the iterative decoding process.

2. A decoding method according to claim 1, wherein alphabet A is made up of $q=2^p$ elements and $\bar{p}=q-1$.

3. A decoding method according to claim 1 or 2, wherein said parity matrix, $\overline{H}_{bin}$, is completed by adding additional rows, said additional rows being obtained by means of distinct linear combinations, with coefficients from $F_2$, of existing rows, excluding the zero combination, each row of the matrix thus completed defining an extended parity check, the extended graph then connecting the set of extended binary values of the variables with the set of extended parity checks of matrix $\overline{H}_{bin}$ thus completed.

4. A decoding method according to claim 3, wherein the number of additional rows added in is q−p−1.

5. A decoding method according to claim 1, wherein at least part of the extended binary values of each variable is initialized using its own binary values.

6. A decoding method according to claim 1 wherein, for at least one iteration of the iterative decoding process, the extended binary values of each variable are subjected to a maximum-likelihood decoding to obtain estimated extended binary values confirming a set of constraints induced by said $\bar{p}$ linear combinations, said extended binary values being replaced, for each variable, by said estimated extended binary values for the purpose of continuing the iterative decoding process.

7. A decoding method according to claim 1 wherein, for at least one iteration of the iterative decoding process, the messages passed by the extended binary values of each variable are corrected in the maximum-likelihood sense to confirm a set of constraints induced by said $\bar{p}$ linear combinations, and said passed messages are replaced, for each variable, with said corrected messages for the purpose of continuing the iterative decoding process.

8. A decoding method according to claim 1 wherein, for at least one iteration of the iterative decoding process, the messages received by the extended binary values of each variable are corrected in the maximum-likelihood sense to confirm a set of constraints induced by said $\bar{p}$ linear combinations, and said received messages are replaced, for each variable, by said corrected messages for the purpose of continuing the iterative decoding process.

9. A decoding method according to claim 1, which uses in addition an auxiliary graph connecting the binary values to the extended binary values of the variables, said auxiliary graph representing the linear combinations that allow the latter to be generated from the former.

10. A decoding method according to claim 9, wherein the iterative decoding step includes at least a first phase of message passing between the binary values and the extended binary values of the variables, through said auxiliary graph, and a second phase of message-passing between the binary values of the variables and the extended parity checks, through said extended graph.

11. Transmission method for transmitting non binary codewords belonging to a non-binary code amenable to representation by a bipartite graph, in particular LDPC non binary code, each non-binary symbol of a codeword ($X_1, X_2, \ldots, X_N$) belonging to an alphabet A of cardinal $q=2^n$ and being represented by p bits, where p is an integer, characterized in that a plurality $\tilde{p}$ of bits, with $p<\tilde{p}\leq q-1$, called extended bits, are generated for each non binary symbol, said extended bits being obtained by $\tilde{p}$ linear combinations with coefficients from $F_2$ of said p bits, excluding the zero combination, wherein $F_2$, is a two element Galois field;

the extended bits thus generated are punctured according to a puncturing pattern to output E extended bits per codeword;

the E extended bits thus output are converted into modulation symbols of a modulation constellation;

the modulation symbols thus obtained are transmitted over a transmission channel.

12. Transmission method according to claim 11, characterized in that the puncturing rate ($R_p$) is controlled according to a quality indicator (CQI) of the transmission channel received by said transmitter.

13. Transmission method according to claim 12, characterized in that the size of the modulation constellation is controlled according to said quality indicator.

14. Transmission method according to any claims 11 to 13, characterized in that, for each non binary symbol, the $\tilde{p}$ extended bits comprise the said p bits, referred to as trivial extended bits, and $\tilde{p}-p$ remaining bits, referred to as true extended bits, said puncturing being performed on the true extended bits only.

15. Transmission method according to claim 14, characterized in that the size of the modulation constellation is equal to $2^m$ and that the $\tilde{p}-p$ true extended bits are punctured to retain only m-p true extended bits, the p trivial extended bits and m-p true extended bits related to a non-binary symbol being mapped into one modulation symbol of said modulation constellation.

16. Transmission method according to claim 15, characterized in that $\tilde{p}=q-1$.

17. Transmission method according to claim 11, characterized in that a first plurality E of extended bits, sent in a first transmission step and a second plurality E' of extended bits, distinct from those of the first plurality, is sent in a second transmission step, on request from a receiver.

18. Transmission method according to claim 14, characterized in that said trivial extended bits are sent in a first transmission step and that the true extended bits output by the puncturing are sent in a second transmission request, on a request from a receiver.

19. Transmission method according to claim 14, characterized in that the trivial extended bits are sent in a first transmission packet and that the true extended bits output by the puncturing are systematically sent in a second transmission packet after said first transmission packet has been sent.

20. Receiving method for receiving non binary codewords belonging to a non-binary code, in particular non-binary LDPC code, transmitted by a transmission method according to claim 11, said non-binary code being amenable to representation by a bipartite graph with N variable vertices and M constraint vertices, the variables drawing their values from said alphabet A and being linearly constrained by means of a constraint matrix, each variable corresponding to a non-binary symbol of a codeword and being represented by a plurality q-1 of extended binary values, said extended binary values being obtained by q-1 linear combinations with coefficients from $F_2$ of said p binary values, wherein $F_2$ is a two element Galois field, wherein:

for each variable, $\tilde{p}$ extended binary values of said plurality of extended values are initialized with estimated values of the $\tilde{p}$ bits of the corresponding non-binary symbol received from the transmitter;

an iterative message-passing decoding process is carried on an extended graph representing an extended parity matrix connecting the extended binary values of the variables with extended parity checks;

the binary values of each variable are determined from its extended binary values, obtained at the conclusion of the iterative decoding process.

* * * * *